United States Patent [19]

Gersbach

[11] Patent Number: 5,384,546
[45] Date of Patent: Jan. 24, 1995

[54] TIME DOMAIN COMPONENT MULTIPLEXOR

[75] Inventor: John E. Gersbach, Burlington, Vt.

[73] Assignee: International Business Machine Corp., Armonk, N.Y.

[21] Appl. No.: 148,600

[22] Filed: Nov. 8, 1993

[51] Int. Cl.⁶ .......................................... H03K 17/56
[52] U.S. Cl. ..................................... 327/411; 327/407
[58] Field of Search ........................ 307/241, 242, 491; 328/103, 104, 152, 153, 154

[56] References Cited

U.S. PATENT DOCUMENTS

| | | | |
|---|---|---|---|
| 3,588,748 | 10/1967 | Inaba et al. | 332/44 |
| 4,205,518 | 6/1980 | Morokawa | 368/67 |
| 4,396,883 | 8/1983 | Holloway et al. | 323/313 |
| 4,616,142 | 10/1986 | Upadhyay et al. | 307/242 |
| 4,673,866 | 6/1987 | Masuda | 323/313 |
| 4,810,948 | 3/1989 | Takuma | 323/280 |
| 4,810,949 | 3/1989 | Schiemenz et al. | 323/354 |
| 4,847,523 | 7/1989 | Schneider | 328/167 |
| 4,849,662 | 7/1989 | Holberg et al. | 307/520 |
| 4,896,157 | 1/1990 | Mijuskovic | 341/144 |
| 4,912,339 | 3/1990 | Béchade et al. | 307/242 |
| 5,059,820 | 10/1991 | Westwick | 307/296.6 |

FOREIGN PATENT DOCUMENTS 0493917  2/1976  U.S.S.R. ............................... 307/242

OTHER PUBLICATIONS

W. E. Haas, "R-2R Multiplexing Digital-to-Analog Converter," IBM Technical Disclosure Bulletin, vol. 29, No. 3, Aug. 1986, pp. 1175-1176.

Primary Examiner—Timothy P. Callahan
Assistant Examiner—Toan Tran
Attorney, Agent, or Firm—Francis J. Thornton

[57] ABSTRACT

An integrated circuit in which closer matching or tracking of critical components, both active and passive, is achieved by time domain multiplexing of these critical components. Time domain multiplexing means that each of the components to be matched is alternately and sequentially, electronically switched between selected positions in the circuit. This is accomplished by continuous electronic movement or rotation of the critical components into or out of selected circuit positions to average in the circuit output any inherent errors due to variations resulting from electrical and physical characteristics appearing in the components. This arrangement is particularly useful in compensating for variations induced by the process used to create the components. This time domain multiplexing is especially useful in analog circuits employing complementary metal on silicon (CMOS) transistors, both field effect and bipolar in which component tracking is required for quality operation.

18 Claims, 2 Drawing Sheets

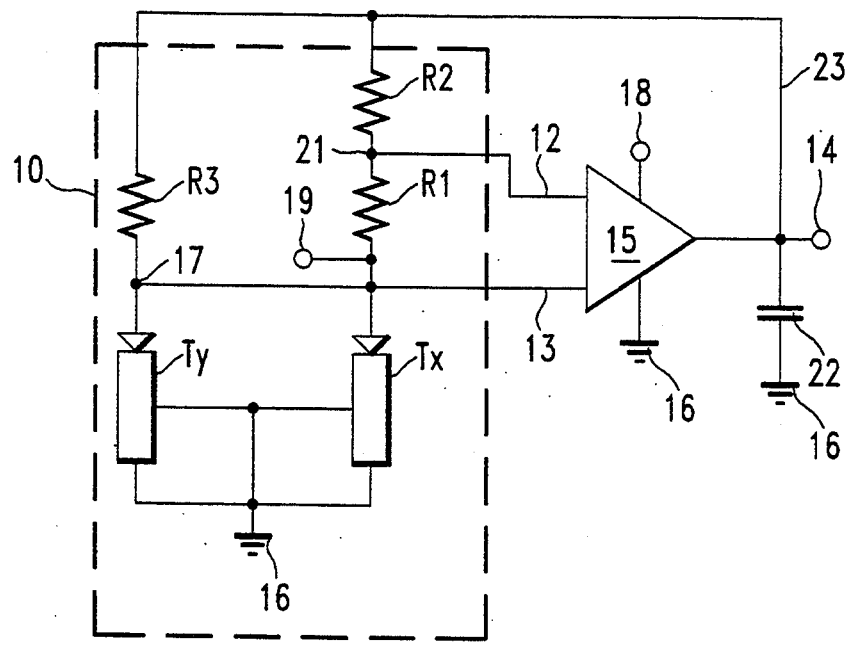
FIG. 1 PRIOR ART
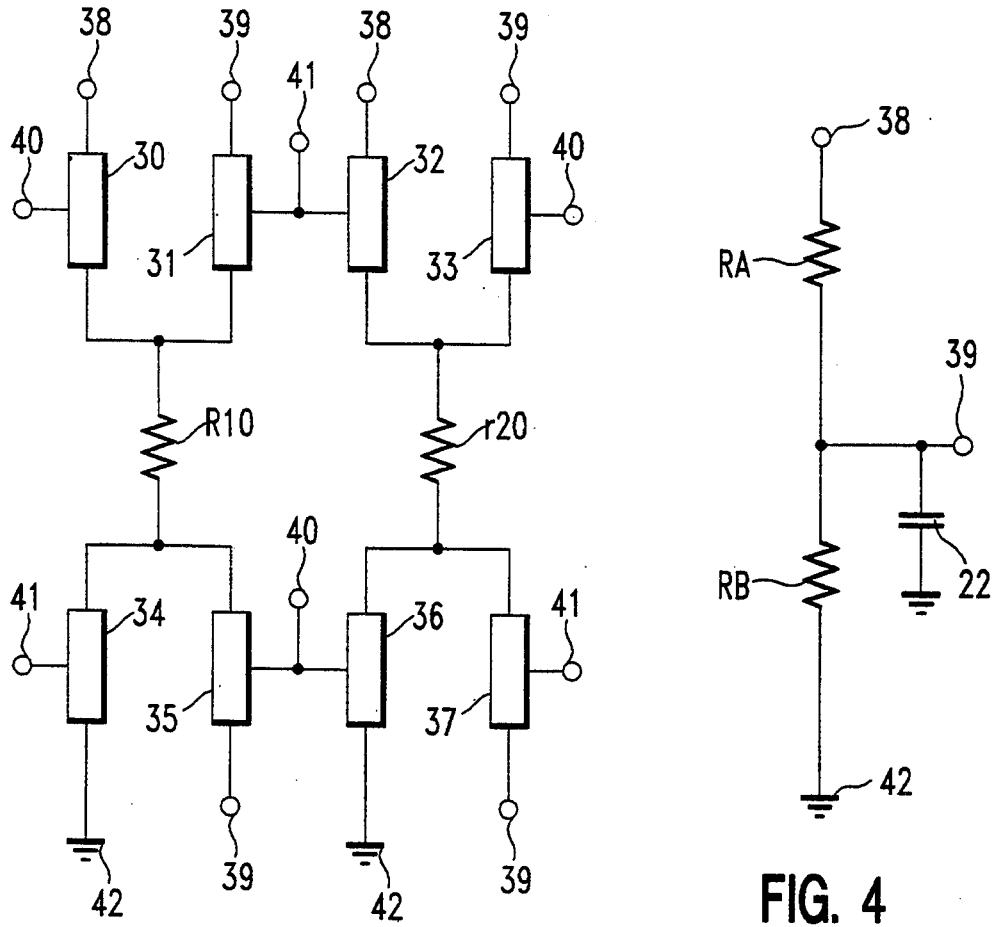
FIG. 3
FIG. 4

TIME DOMAIN COMPONENT MULTIPLEXOR

FIELD OF THE INVENTION

This invention relates generally to integrated circuits and more particularly to an integrated circuit in which matching of critical components can be more closely achieved by time domain multiplexing of these critical components. This time domain multiplexing is realized by continuous electronic rotation of the critical components into and out of selected circuit positions to average out in the circuit output any inherent errors due to variations resulting from electrical and physical characteristics appearing in the components. This arrangement is particularly useful in compensating for variations induced by the process used to create the components. This multiplexing thereby enhances matching between the critical components.

BACKGROUND OF THE INVENTION

AS integrated circuits, become faster and denser they become more sensitive to process variations. This is especially true in analog circuits employing complementary metal on silicon (CMOS) transistors, both field effect and bipolar. In such a case these circuits require component tracking for quality operation. As used herein component tracking means the matching of selected electrical characteristics of both active and passive devices in the circuit. For superior results, in integrated analog circuits, it is necessary the transistors track one another more closely than the manufacturing processes used to create them can provide.

Techniques for improving component tracking include physical abrasion of resistive deposits on the surface of the integrated circuit or by counter doping of selected regions as well as improved process controlling the making of these circuits. Most of these efforts have been found to be so expensive or time consuming or difficult as to be impracticable or cost prohibitive for use in manufacturing.

Accordingly it is desired that an inexpensive but highly accurate way of achieving such tracking of both active (e.g.,transistors) or passive (e.g., resistors) devices in integrated circuits be found.

SUMMARY OF THE INVENTION

The present invention achieves improved component tracking by time domain multiplexing, i.e., the process whereby each component, of the components to be matched, is alternately and sequentially, electronically switched or rotated between selected positions in the circuit. With such switching, each component first appears in one position in the circuit and is then electronically moved in a selected time sequence out of that position into a different position in the circuit. The continuous electronic rotation or movement of the selected components of the circuit between positions averages out any electrical or physical variations that might exist between the components such as might be caused by the process used to create the components. This rotation, as taught by the present invention, enhances matching between the components. This electronic moving of the component can be carried out through numerous positions. By so rotating the devices through the various positions, any errors between the components become averaged out and the circuit response is significantly improved.

The present invention thus results in an improved integrated circuit in which the effects of variations produced in the components by the process used can be effectively averaged out.

More specifically, the present invention provides a circuit for improving the component tracking by alternately and sequentially switching the components between selected nodes in the circuit to provide a more precise circuit than can be produced with presently available prior art techniques or technology.

By so rotating the components through the selected sequence the errors induced in the component characteristics due to the process used to produce the circuit in integrated form are eliminated.

Accordingly it is an object of the invention to provide a circuit which provides a more precise output.

It is another object of the invention to provide a circuit in which physical trimming of the components can be eliminated.

These and other objects and features of the present invention will become further apparent from the following description taken in conjunction with the drawings.

BRIEF DESCRIPTION OF THE DRAWINGS

FIG. 1 is a schematic of a typical prior art band gap cell voltage regulator circuit.

FIG. 3 is a resistor divider circuit modified in accordance with the present invention.

FIG. 4 is the equivalent circuit of FIG. 3.

DESCRIPTION OF THE PREFERRED EMBODIMENT

Figure 2:
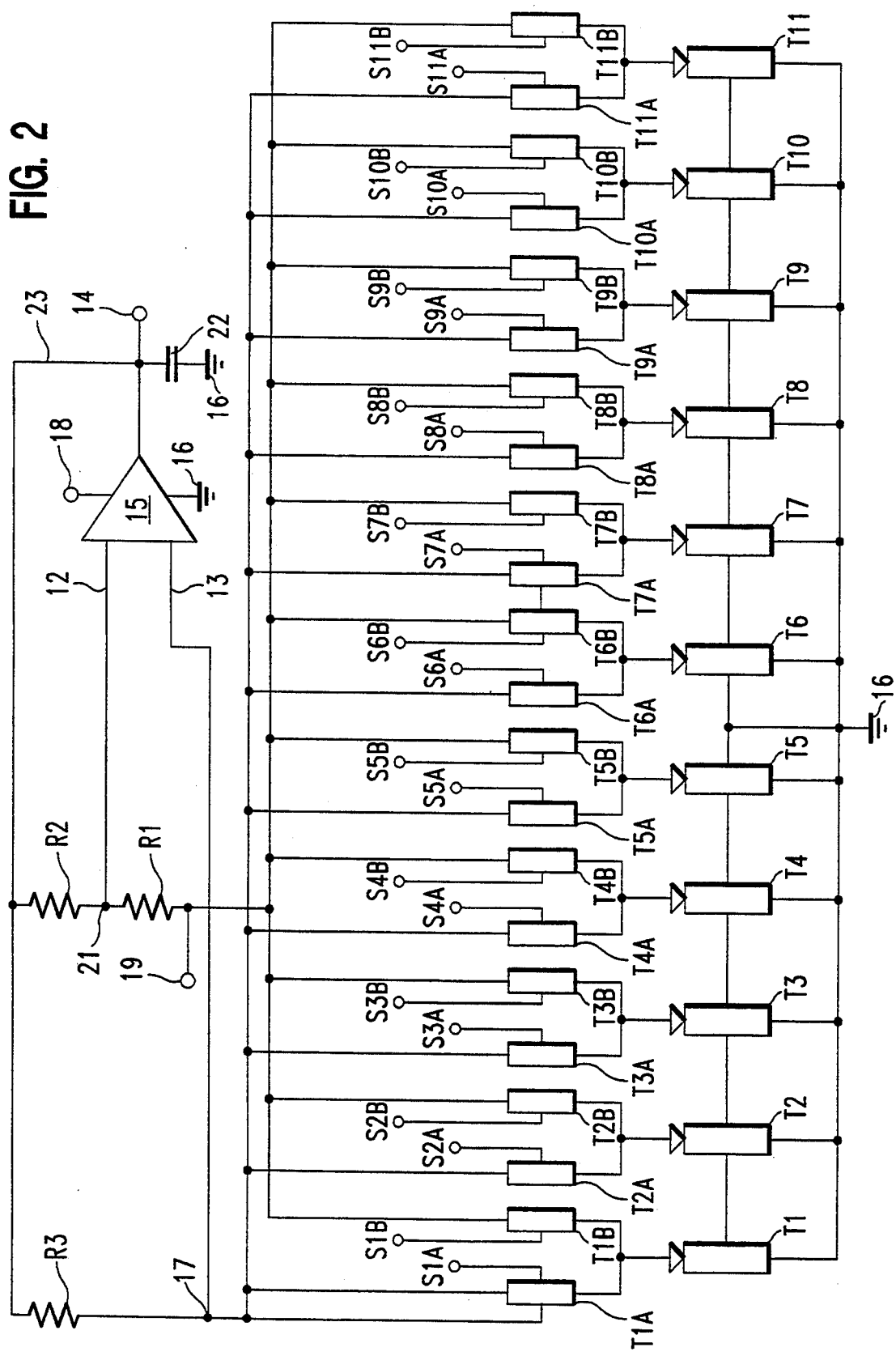
FIG. 2 is a schematic of the band gap circuit of FIG. 1 employing the present invention to enhance the matching between the transistors of the circuit.

FIG. 1 shows, in schematic form, a voltage regulator comprising a band gap cell 10 coupled to both the inputs 12 and 13 and the output 14 of an operational amplifier 15. The operational amplifier 15 is coupled to a voltage source 18 and to ground 16. The band gap cell comprises first and second PNP bipolar transistors $T_x$ and $T_y$, with good base to emitter voltage ($V_{be}$) matching and an emitter area ratio of 10 to 1 and resistors R1, R2, and R3. Transistor $T_y$ has its collector and base both coupled to ground 16 and its emitter coupled to a node 17 and thence through resistor R3 to output 14 of operational amplifier 15. Transistor $T_x$ also has its collector and base coupled to ground 16. The emitter of transistor $T_x$ is coupled to node 19 and through series resistors R1 and R2 to output 14 of operational amplifier 15. Serial resistors R1 and R2 form a voltage divider and have a common node 21 therebetween. Nodes 17 and 21 are connected respectively to the inputs 13 and 12 of the operational amplifier 15. The output 14 of the amplifier 15 is coupled to ground 16 through a decoupling capacitor 22 and via a feedback loop 23 to the cell 10.

This circuit basically relies on the tracking of the two transistors, $T_y$ and $T_x$ which, as discussed above, should have good base to emitter voltage ($V_{be}$) matching and an emitter area ratio of 10 to 1. To achieve the desired 10:1 ratio, transistor $T_x$ will be presumed to have an emitter area ten times larger than the emitter area of transistor $T_y$. The amplifier 15, due to its high gain and feedback through R2 and R3, applies a virtual short across its inputs 12 and 13 to force equal currents in transistors $T_x$ and $T_y$ (assuming R2=R3). The value of R1 is chosen to give a voltage drop equal to the difference voltage between the $V_{be}$ of transistor $T_y$ and that of transistor $T_x$ when they operate at a current density ratio of 10:1. The temperature coefficient of the voltage drop across R3 is then equal and opposite to the $V_{be}$ of transistor $T_y$ so that a stable voltage with respect to temperature and approximately equal to the band gap of silicon appears at output node 14. Any $V_{be}$ tracking errors between transistors $T_x$ and $T_y$ will cause proportional fluctuations in the output voltage at node 14. It is desirable that such fluctuations in the output be avoided or minimized.

FIG. 2 is a schematic of the band gap cell of FIG. 1 using the present invention to enhance the $V_{be}$ matching between the transistors. In this FIG. 2 a plurality of PNP transistors T1, T2, T3, T4, T5, T6, T7, T8, T9, T10, and T11 have their emitters coupled to accompanying respective N-type field effect (NFET) multiplexor transistors T1A and T1B, T2A and T2B, T3A and T3B, T4A and T4B, T5A and T5B, T6A and T6B, T7A and T7B, T8A and T8B, T9A and T9B, T10A and T10B, and T11A and T11B, and their collectors and bases coupled to ground 16. The drains of multiplexor transistors T1A through T11A are coupled to node 17. The gates of transistors T1A through T11A are coupled to respective clocks or digital input signal sources S1A through S11A. The drains of multiplexor transistors T1B through T11B are coupled to node 19. The gates of transistors T1B through T11B are coupled to respective clocks or digital input signal sources S1B through S11B. The PNP transistors T1, T2, T3, T4, T5, T6, T7, T8, T9, T10, and T11 and their accompanying respective NFET multiplexor transistors T1A and T1B, T2A and T2B, T3A and T3B, T4A and T4B, T5A and T5B, T6A and T6B, T7A and T7B, T8A and T8B, T9A and T9B, T10A and T10B, and T11A and T11B, are thus substitutable for the transistors $T_x$ and $T_y$ of the band gap cell. The remainder of the circuit, however, remains unchanged from that shown in FIG. 1 and the numerals identifying the various circuit components remains the same in this FIG. 2.

This circuit operates as follows:

The transistors T1 through T11 all have their respective emitters coupled through respective ones of the multiplexor transistors T1A through T11A and T1$b$ through T11B which are controlled by respective sources of digital input signals S1A through S11A and S1B through S11B. The sequence in which these digital inputs signals are applied to the gates of the multiplex transistors determine how the various PNP transistors T1 through T11 are to be coupled to nodes 17 and 19.

As noted, in the above description of FIG. 1, transistor $T_x$ had an emitter area ten times larger than the emitter area of transistor $T_y$. To achieve this same ratio of 10:1 in FIG. 2 any ten of the transistors T1 through T11 must be substituted for transistor $T_x$ and the remaining transistor must be substituted for transistor $T_y$. To achieve the desired ratio of 10:1 discussed above the complete commutation cycle is divided into 11 time slots.

In the first time slot this is achieved, for example, when signal source S1A and signal sources S2B through S11B are all high, thus applying a positive voltage to the gate of transistor T1A and to the gates of transistors T2B through T11B. When the high signals from these signal sources are so applied to the respective transistors, transistor T1A and transistors T2B through T11B all turn on causing transistor T1 to be connected to node 17 and transistors T2 through T11 to be connected to node 19. Simultaneously because the complementary signal source S1B and the sources S2A through S11A are all low, and thus applying a negative voltage to the gates of transistors T1B and T2A through T11A, these transistors are all shut off isolating transistor T1 from node 19 and isolating transistors T2 through T11 from Node 17. In this way transistor T1 is substituted for transistor $T_y$ and transistors T2 to T11 are substituted for transistor $T_x$.

In the next time slot, signal source S2A and signal sources S1B and S3B through S11B are all high, i.e., a positive voltage is applied to the gate of transistor T2A and to the gates of transistors T1B and T3B through T11B. When the signal from these signal sources are so applied to the respective transistors, transistor T2A and transistors T2B through T11B all turn on causing transistor T2 to be connected to node 17 and transistors T1 and T3 through T11 to be connected to node 19. Simultaneously, because the complementary signal source S1A, applied to the gate of transistor T1B, and the complementary signal sources S3A through S11A, applied to the gates of transistors T3A through T11A are all low, i.e., they apply a negative voltage to the gates of transistors T1B and T3A through T11A, all these transistors T1B and T3A through T11B are shut off isolating transistor T2 from node 19 and isolating transistors T1 and T3 through T11 from Node 17. In this time slot transistor T2 replaces transistor $T_y$ and transistors T1 and T3 to T11 replace transistor $T_x$.

By progression through additional time slots (3 to 11) this sequencing continues so that each transistor T3, T4, T5, T6, T7, T8, T9, T10, and T11 becomes, in turn, substituted for transistor $T_y$ and connected to node 17. As each of these become substituted for transistor $T_y$ the other ten transistors become substituted for transistor $T_x$ and become connected to node 19. When transistor T11 becomes coupled to node 17 and transistors T1 through T10 become coupled to node 19, the first cycle is complete and a new cycle begins when transistor T1 is again connected to node 17. Over any one cycle the average emitter area associated with node 17 is the sum of the emitter areas of T1 through T11 divided by the number of time slots in the cycle. Over the same cycle the average emitter areas associated with node 19 is the accumulated sums of the sum of the remaining ten transistors in each time slot again divided by the number of time slots.

Whenever the individual transistors T1 through T11 do not operate at the same bias level, the commutation process moves charge from one node to the other, thus setting up a current flow of amplitude dq/dt where dq is the difference in charge levels and dt is the length of time in a single time slot. This undesired current may be minimized by maximizing dt. The upper limit of dt is determined by the low frequency filtering of the circuit which is set by the capacitor 22, the resistors R2, and R3 and the output impedance of operational amplifier 15.

There is another charge transfer mechanism through the multiplex transistors during the switching transient of the signals applied to their gate. This charge transfer mechanism can be minimized by fast transitions of the signals and also by maximizing the time between transitions, i.e., dt.

The present invention as set forth in FIG. 2 avoids the difficulties of the circuit shown in FIG. 1 because instead of relying on only two fixed transistors $T_x$ and $T_y$, it now permits any one of the eleven transistors T1 through T11 to be selectively substituted for transistor $T_y$, while the remaining ten transistors are simultaneously substituted for transistor $T_x$ thus averaging out the emitter areas as discussed above.

It should be noted that different effective area ratios can quickly and easily be obtained by merely changing the timing patterns applied to the gates of the multiplexing transistors. With a circuit using 11 transistors, as taught above, ratios of 9:2, 8:3, 7:4, 6:5 and their inverse values are readily achievable by altering the timing patterns. By altering the number of transistors still different ratios can be obtained and by altering both the number of transistors and the timing patterns still more ratios can be obtained.

Turning now to FIGS. 3 and 4, the invention will be discussed in conjunction with passive components. In particular FIG. 3 shows a schematic of a resistor divider circuit modified in accordance with the present invention.

The resistor divider of FIG. 3 is comprised of a first resistor R10 coupled, at a first end, to the sources of a first pair of NFET multiplexing transistors 30 and 31 whose drains are respectively connected to a voltage source 38 and an output node 39. The gate of transistor 30 is coupled to a first digital input signal source 40 while the gate of transistor 31 is connected to the complement signal source 41. The resistor R10 is coupled at its other end to the drains of a second pair of NFET multiplexing transistors 34 and 35. The source of transistor 34 is connected to ground 42 and the source of transistor 35 is coupled to output 39. The gate of transistor 35 is connected to the signal source 40 and the gate of transistor 34 is connected to the signal source 41.

A second resistor R20 is coupled in series with resistor R10. Resistor R20 is coupled, at a first end, to the sources of a third pair of NFET multiplexing transistors 32 and 33 whose drains are respectively connected to a voltage source 38 and an output node 39. The gate of transistor 32 is coupled to the first digital input signal source 40 while the gate of transistor 33 is connected to the complement signal source 41. The resistor R20 is coupled at its other end to the drains of a fourth pair of NFET multiplexing transistors 36 and 37. The source of transistor 36 is connected to ground 42 and the source of transistor 37 is coupled to output 39. The gate of transistor 36 is connected to the signal source 40 and the gate of transistor 37 is connected to the signal source 41.

Thus the drains of transistors 30 and 32 are coupled in common to each other and in common with the sources of transistors 35 and 37, and the gates of transistors 30, 33, 35, and 36 are also coupled in common to the signal source 40 while the gates of transistors 31, 32, 34, and 37 are all coupled in common to the complementary signal source 41.

The circuit of FIG. 4 is the equivalent of the circuit shown in FIG. 3 and is a simple voltage divider circuit. Such circuits and their operation are well know and need not be discussed in detail. Let it suffice to state that the voltage established at output 39 is determined by the voltage drops across resistors RA and RB. If these resistors RA and RB track one another, the voltage at output 39 will be more closely regulated.

Since only two resistors are needed for this voltage divider the circuit of FIG. 3 when used as taught by the present invention need only be operated on a 50% duty cycle sequence so that when the digital input signals and their complements are applied to the gates of the various multiplexor transistors, the resistors R10 and R20 are alternately coupled between the output 39 and either voltage source 38 or ground 42.

The operation of FIG. 3 will now be explained in conjunction with FIG. 4.

In the first time slot, it will be assumed, for example, that signal source 40 is high, i.e., applying a positive voltage to the gates of transistors 30, 33, 35, and 36 and the complement signal source 41 is low, i.e., applying a negative signal to the gates of transistors 31, 32, 34, and 37. When the signal from these signal sources are so applied, transistors 30, 33, 35, and 36 all turn on causing resistor R10 to be connected between source 38 and output 39 and resistor R20 to be connected between output 39 and ground 42. Simultaneously transistors 31, 32, 34, and 37 are all shut off. With this sequence of applied signals resistor R10 appears in the position occupied by resistor RA, as shown in FIG. 4, and resistor R20 appears in the position occupied by resistor RB, as shown in FIG. 4.

In the next time slot, signal source 40 goes low, i.e., a negative voltage is applied to the gate of transistors 30, 33, 35, and 36. When the signal from this signal source is so applied to the respective transistors, they all turn off. Simultaneously, the complementary signal from source 41, applied to the gates of transistors 31, 32, 34, and 37, goes high, i.e., applying a positive voltage, transistors 31, 32, 34, and 37 are all on and connect resistor R10 between output 39 and ground 42 and connect resistor R20 between source 38 and output 39. With this sequence of applied signals transistor R10 appears in the position occupied by resistor RB, as shown in FIG. 4, and resistor R20 appears in the position occupied by resistor RB, as shown in FIG. 4.

This sequencing continues so that each resistor, R10 and R20 becomes, in turn, substituted for resistor RA and then for resistor RB so that at first one is connected between voltage source 38 and output 39 and then connected between the output 39 and ground. As one of these resistors become substituted for resistor RA the other becomes substituted for resistor RB. This produces equivalent resistances of (R10+R20)/2 for both RA and RB to give a precise ratio of 1:1. Other ratios can easily be obtained by adding resistors, and suitable accompanying multiplexor transistors and signal sources.

It should bet noted that the connection 16 in FIGS. 1 and 2 and connection 42 in FIGS. 3 and 4 could be to a voltage source .such as negative voltage source instead of to ground.

It should be understood that although the present invention has been described as being used with an analog circuit that it may be profitably used in any circuit in which precise tracking of a series of similar components, both active and passive, is desired.

It should also be understood that although the multiplexing transistors were portrayed as N-type field effect transistors, bipolar transistors could be used.

While the invention has been particularly described with respect to a preferred embodiment, it should be understood that one skilled in the art can, from the foregoing, readily make changes in form and detail without departing from the spirit and scope of the invention.

What is claimed is;

1. In a circuit having an output and a plurality of components:

at least first and second ones of said components being coupled together in a first configuration in said circuit;

input signal source means for producing first and second signals; and switching means, coupled to each of said components and receiving said first and second signals from said signal means, for switching said first and second components from said first configuration into a second configuration different from said first configuration, thereby reducing dependency of the circuit output on electrical and physical variations in said components.

2. The circuit of claim 1 wherein said input signal source includes complementary signal sources.

3. The circuit of claim 1 wherein said components include transistors.

4. The circuit of claim 3 wherein said switching means comprises a plurality of multiplexors.

5. The circuit of claim 4 wherein each of said multiplexors comprise first and second field effect transistors.

6. The circuit of claim 3 wherein said transistors are bipolar transistors.

7. The circuit of claim 1 wherein said components include resistors.

8. An electronic circuit comprising:

first and second components between which a ratio is to be established;

one of said components being initially in a first position in said circuit;

the other of said components being initially in a second position in said circuit;

multiplexor means coupled to each of said components; and control means coupled to said multiplexor means to sequentially and continuously electronically reposition said one of said components from said first position to said second position and then back to said first position and simultaneously electronically reposition said other of said components from said second position to said first position and then back to said second position to produce precise matching of selected electrical characteristics of the components.

9. The circuit of claim 8 wherein said control circuit comprises a signal source providing complementary signals.

10. An electronic circuit comprising:

first and second voltage inputs;

an output;

first and second components between which a ratio is to be established, said first component being electronically coupled between said first input and said output and said second component being electronically coupled between said second input and said output;

multiplexor means coupled to each of said components; and control means coupled to said multiplexor means to sequentially and continuously electronically switch said components between said inputs and said output to produce precise matching of selected electrical characteristics of the components.

11. The circuit of claim 10 wherein one of said inputs is a voltage source and the other is ground.

12. In an electronic circuit:

a plurality of components;

each of said components being coupled through a first multiplexor to a first node and through a second multiplexor to a second node; and input signal source means, coupled to each of said multiplexors, for producing first and second signals that cause said multiplexors to selectively couple and decouple a selected one of said components to and from said first node and simultaneously couple and decouple the remainder of said components to and from said second node to form a series of circuit configurations from said components.

13. The circuit of claim 12 wherein said components are active devices.

14. The circuit of claim 12 wherein said components are passive devices.

15. The circuit of claim 12 wherein said components are transistors.

16. The circuit of claim 15 wherein said transistors are bipolar devices.

17. A method of sequentially and electronically switching the effective electrical positions of first and second components in a circuit comprising the steps of:

coupling each of said first and second components in said circuit to both first and second nodes of said circuit through respective multiplexor circuits;

coupling complementary signal sources to said multiplexor circuits;

applying a first set of complementary signals to said multiplexor circuits from said sources to connect said first component to said first node and said second component to said second node; and applying a second set of complementary signals to said multiplexor circuits from said sources to disconnect said first component from said first node and connect it to said second node and simultaneously disconnect said second component from said second node and connect it to said first node to thus interchange the positions of said components.

18. A method of sequentially and electronically interchanging the effective electrical positions of components in a circuit comprising the steps of:

coupling a plurality of substantially identical components in said circuit to first and second nodes of said circuit through respective multiplexor circuits;

coupling complementary signal sources to said multiplexor circuits;

applying a first set of complementary signals to said multiplexor circuits from said sources to initially connect at least one of said components to said first node and at least one of the remaining components to said second node;

applying a second set of complementary signals to said multiplexor circuits from said sources to (a) disconnect said component initially connected to the first node from the first node and connect it to the second node and (b) simultaneously disconnect the component initially connected to the second node from the second node and connect it to the first node thus interchanging the positions of said components;

reapplying the first set of complementary signals to said multiplexor circuits from said sources to disconnect the component from the second node and reconnect it to the first node and disconnect the component from the first node and reconnect it to the second node;

reapplying the second set of complementary signals to said multiplexor circuits from said sources to disconnect said the component now connected to the first node from the first node and connect it to the second node and simultaneously disconnect the component not connected to the second node from the second node and connect it to the first node; and repeating said steps to continuously interchange said components.

* * * * *